United States Patent
Hutton et al.

(10) Patent No.: US 6,977,520 B1
(45) Date of Patent: Dec. 20, 2005

(54) TIME-MULTIPLEXED ROUTING IN A PROGRAMMABLE LOGIC DEVICE ARCHITECTURE

(75) Inventors: Michael D. Hutton, Mountain View, CA (US); Richard G. Cliff, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 150 days.

(21) Appl. No.: 10/219,085

(22) Filed: Aug. 13, 2002

(51) Int. Cl.$^7$ .............................................. H03K 19/173
(52) U.S. Cl. ........................................ 326/38; 326/46
(58) Field of Search .............................. 326/37–41, 46

(56) References Cited

U.S. PATENT DOCUMENTS

| | | | |
|---|---|---|---|
| 5,550,782 A | 8/1996 | Cliff et al. | 365/230.03 |
| 5,689,195 A | 11/1997 | Cliff et al. | 326/41 |
| 6,107,825 A | 8/2000 | Lane et al. | 326/41 |
| 6,215,326 B1 * | 4/2001 | Jefferson et al. | 326/41 |
| 6,272,655 B1 | 8/2001 | Hecht et al. | 714/725 |
| 6,429,681 B1 | 8/2002 | Hutton | 326/41 |
| 6,617,877 B1 * | 9/2003 | Cory et al. | 326/41 |
| 2003/0112031 A1 * | 6/2003 | Agrawal et al. | 326/41 |

OTHER PUBLICATIONS

Giovanni De Micheli, *Synthesis and Optimization of Digital Circuits*, McGraw–Hill, Inc., New York, 1994, Chapter 9, pp. 441–503.

Amit Singh, et al., *Interconnect Pipelining in a Through-put–Intensive FPGA Architecture*, FPGA 2001, Feb. 11–13, 2001, Monterey, CA, USA, pp. 153–160.

Deshanand Singh, et al., *The Case for Registered Routing Switches in Field Programmable Gate Arrays*, FPGA 2001, Feb. 11–13, 2001, Monterey, CA, USA, pp. 161–169.

\* cited by examiner

*Primary Examiner*—Don Le
(74) *Attorney, Agent, or Firm*—Fish & Neave IP Group Ropes & Gray LLP; Jeffrey C. Aldridge (57) ABSTRACT

Programmable logic device interconnection resources include bus wires. A bus wire provides a programmable signal path across the programmable logic device from several logic device outputs to several other logic device inputs.

Serializing circuitry multiplexes multiple device output signals and drives time-multiplexed data signals on the bus wires. Bus registers placed at the ends of bus wires register or buffer the data signals transmitted over the bus wires. The registered signals are passed on to deserializing circuitry for demultiplexing data signals to provide parallel device input signals. The bus registers, and the serializing/deserializing circuitry are clocked at a rate faster than the device system clock to schedule the use of the bus wires for transmission of multiple device input/output signals over the bus wires within a system clock cycle.

43 Claims, 7 Drawing Sheets

TIME-MULTIPLEXED ROUTING IN A PROGRAMMABLE LOGIC DEVICE ARCHITECTURE

BACKGROUND OF THE INVENTION

Programmable logic devices (PLDS) are integrated circuit devices with configurable logic networks linked together by programmable interconnection resources. The configurable logic networks may include device elements such as logic cells (e.g., look-up tables (LUTs) or product term logic), memory cells, and input-output cells. Registers (e.g., D-type flip-flops) may be associated with one or more of the device elements. The registers hold and transfer data signals (i.e., variables) between the device elements during device operation.

The device elements of a conventional PLD are often architecturally organized into blocks of programmable logic (e.g., gate array or logic array block ("LAB")), blocks of input-output cells, and blocks of memory (e.g., random access memory ("RAM")), etc. Groups of these blocks may make up larger blocks (i.e., "super-regions") that are arranged, for example, in an X-Y array. The programmable interconnection resources of the PLD are organized as rows and columns of conductors for selectively routing signals to, from, and between the logic, input-output, and memory blocks. See, for example, Cliff et al. U.S. Pat. No. 5,550,782, Cliff et al. U.S. Pat. No. 5,689,195, and Jefferson et al. U.S. Pat. No. 6,215,326, all of which show PLD architectures developed by Altera Corporation of San Jose, Calif.; but other examples of architectures with which the present invention can be used include those developed by other PLD manufacturers such as Xilinx, Inc., also of San Jose, Calif.

Complex logic functions (circuits), as desired, may be implemented in present-day PLDs. The logic functions are implemented by interconnecting a select configuration of device elements according to a suitable circuit design. Conventional circuit design techniques for synthesis of logic functions may be used to generate a suitable circuit design. The circuit design may be characterized by a corresponding configuration file (i.e., a netlist) that specifies the placement and interconnection of selected device elements. PLDs usually have a large number of device elements that have identical functionality (e.g., AND gates) and which may be used interchangeably. Therefore, several possible circuit designs (i.e., configurations of device elements) may yield the same desired logic function.

The circuit design which is implemented is,:

usually, optimized for circuit performance. A measure of circuit performance is data signal propagation delay. This delay depends, inter alia, on the length of interconnection and on the number of registers between device elements traversed by data signals. A figure of merit of circuit delay performance is the length (in units of time) of the longest register-to-register delay path ("the critical path") in the circuit. This critical path also determines the minimum cycle time for a logic step in the PLD device. The reference or master clock signal timing various device elements in the PLD is set to have a period or cycle which is greater than the minimum cycle time.

The PLD critical path length may be minimized using "re-timing" techniques for optimizing circuit designs. These techniques address the problem of optimal placement and interconnection of device elements by repositioning registers along the path of data signals. Registers associated with logic cells are repositioned from the cells, output to input or vice versa, so that the critical path is as short as possible. Some circuit designs must use device elements in different regions. For these designs, repositioning of registers along the data path between the device elements in different regions cannot reduce critical path length below the length of a long interconnection that must be used. For example, a PLD cross-chip critical path of about 25 ns may include a long interconnection along which the delay is about 8 ns. Then, the length of the longest interconnection 8 ns sets the smallest time unit or granularity for retiming operations.

Co-owned Hutton U.S. Pat. No. 6,429,681 shows, for example, a way of circumventing the lower bound on time delay due to the longest interconnection length in the data path. The disclosure therein describes the optional insertion of re-timing registers in the interconnections. An inserted retiming register effectively fragments the end-to-end interconnection time delay into two smaller time delay units.

Irrespective of the circuit design optimization techniques available or used, most of the chip area in commercially available PLDS is devoted to programmable interconnection resources. These interconnection resources are responsible for most of the circuit delay. Consideration is now being given to ways of enhancing programming logic device architectures to minimize the chip area devoted to interconnection resources or to reduce the interconnection conductor line count in a PLD.

SUMMARY OF THE INVENTION

In accordance with the present invention, programmable logic device architectures are enhanced by optimizing interconnection resource usage. The invention provides bus wires for interconnection between programable logic blocks or regions. A bus wire can provide a programmable signal path from several outputs of a programmable logic block or region to several inputs of another programmable logic block or region. The output signals are transmitted serially one after another on the bus wire. Multiplexer circuitry may be used to serialize the output signals for transmission over the bus wire. It will be understood that data signals which are transmitted serially may be referred to as "time-multiplexed" data signals herein.

A single bus wire may carry multiple time-multiplexed data signals between the several input/output pairs. A single bus wire may provide the functionality of several interconnection conductors each of which traditionally connects only a single fixed input/output pair.

"Bus" registers are associated exclusively with the bus wires. The bus registers placed at the ends of bus wires may be used to register or buffer data signals to and from programmable logic blocks or regions. The bus registers are not associated with any individual device element such as a logic cell, memory cell, or an input-output cell, and are in addition to registers that are conventionally associated with individual device elements.

The bus registers may have a configuration similar to that of re-timing registers that are disclosed in Hutton U.S. Pat. No. 6,429,681. The bus registers may be placed in parallel to bus wire segmentation buffers. Programmable links associated with the bus registers enable signal data paths between disconnected bus wires or bus wire segments. The signal data paths are enabled through the bus registers by bypassing the segmentation buffers using the programmable links.

Other registers are provided at programable logic blocks or regions for serializing output data signals from the logic blocks or regions, and for deserializing input data signals received over the bus wires.

A programmable divider circuit is provided to generate a register clock signal having a frequency which is a multiple of the PLD chip reference clock signal frequency. Using the register clock signal, the bus, serializing and deserializing registers are clocked at a rate faster than the PLD system or reference clock (PLD minimum execution cycle). The registers may be clocked at a suitable rate to schedule the use of a bus wire for transmission of time-multiplexed data signals over the bus wire within a reference clock cycle.

Further features of the invention, its nature and various advantages will be more apparent from the accompanying drawings and the following detailed description.

DETAILED DESCRIPTION

The present invention is described in the context of the programmable logic device architecture disclosed, for example, in Jefferson et al. U.S. Pat. No. 6,215,326. The architecture disclosed in the Jefferson et al. reference is used only for purposes of illustration, with the understanding that the inventive principles of the present invention are applicable to all PLD architectures.

The Jefferson et al. reference discloses a PLD architecture which partitions the PLD into a hierarchy of regions. Each region may include programmable circuit blocks (e.g., LAB, input-output cells, memory, etc.). Each of these blocks may have a plurality of inputs and outputs. The inputs and outputs of a circuit block may be connected or wired to the inputs and outputs of other circuit blocks by programmable interconnection conductors. The programmable interconnection resources of the PLD are organized as rows and columns of conductors for selectively routing signals to, from, and between the logic, input-output, and memory blocks.

The programmable interconnection resources may include conductors of various lengths. Short length conductors may, for example, be used to connect blocks within a region or within neighboring regions.

Long length conductors may be used, for example, to provide data signal paths between regions or super-regions across the PLD chip.

In particular in the Jefferson et al. reference, imaginary vertical and horizontal lines partition the PLD into four quadrants. Long cross-chip horizontal and vertical conductors are provided for interconnection from one quadrant to another. These long cross-chip conductors are segmented at the partition boundaries by programmable segmentation buffers. The segmentation buffers may be programmed to allow independent use of either of the half lengths or the full length of a long cross-chip conductor as necessary. The segmentation buffers may be implemented using any suitable switching circuitry. The segmentation buffers may, for example, be implemented using tri-state buffers (see e.g., FIG. 2 discussed below) or pass transistors (e.g., CMOS transmission gates).

In accordance with the present invention bus wires are provided to carry time-multiplexed data signals between the inputs and outputs of programmable blocks or regions. The bus wires may include vertical bus wires, horizontal bus wires or a combination of both. Bus registers for registering signals driven on the bus wires are provided at the ends of the bus wires. The bus registers are exclusively associated with the bus wires. A bus wire may have one or more associated bus registers for optional use. Additional data serializing/deserializing circuitry may be provided at programmable logic blocks or regions for loading and unloading time-multiplexed data signals from the bus wires.

Figure 1A:
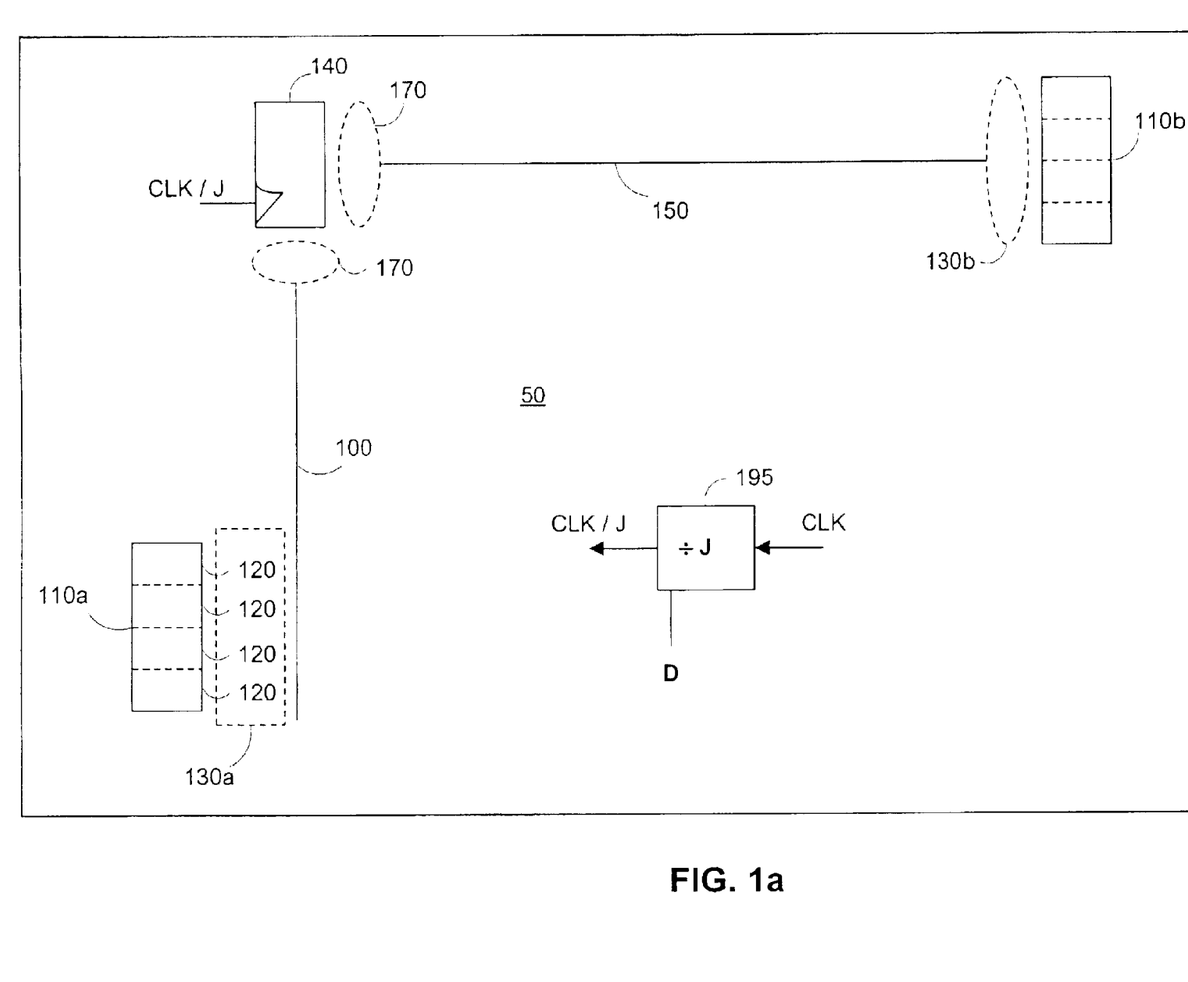
FIG. 1a is a schematic diagram illustrating the provision of registered bus wires capable of transmitting multiple data signals, in accordance with the invention.

FIG. 1a shows PLD 50, for example, with vertical bus wire 100, and horizontal bus wire 150 running along programmable logic array blocks (LABs) 110. Only one LAB 110a along vertical bus wire 100, and one LAB 110b along horizontal bus wire 150 are shown. For clarity, other blocks and/or regions along the bus wires are not shown in FIG. 1a. LAB 110a may, for example, have four output flip-flops 120. Also for clarity, other device elements in LAB 110a, e.g., logic control elements (i.e.,gates) driving flip-flops 120, are not shown in FIG. 1a. LAB 110a output signals may e placed at any or all of output flip-flops 120. Output flip-flops 120 are connected to bus wire 100 through bus connecting circuitry 130a.

Figure 1B:
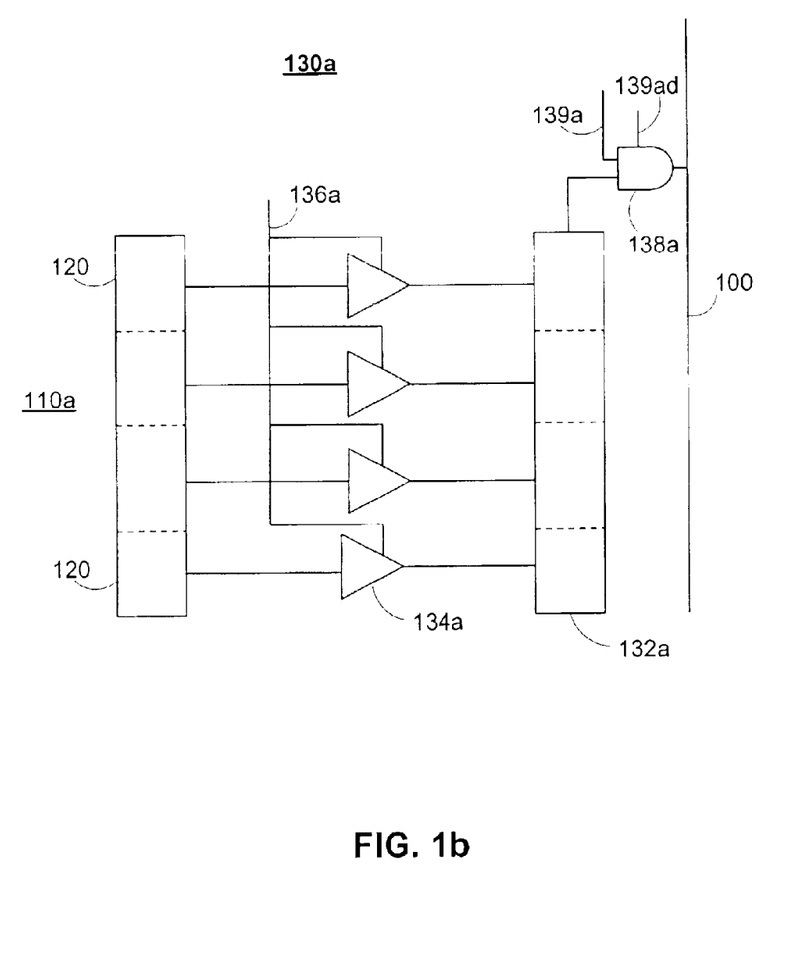
FIG. 1b is a schematic diagram illustrating the provision of serializing circuitry for loading time-multiplexed data signals on a bus wire, in accordance with the invention.

With reference to FIG. 1b bus connecting circuitry 130a may, for example, include shift register 132a. Output flip-flops 120 are connected to shift register 132a, for example, through tristate logic gates 134a. Output data signals stored in flip-flops 120 may be transferred to shift register 132a by activating tristate logic gates 134a by a transfer command signal transmitted over transfer command line 136a. Shift registers associated with one or more LABs along bus wire 100 may be connected to bus wire 100 through conventional tristate logic circuitry. For example, shift register 132a may be connected to bus wire 100 through disconnectable gate 138a. Gate 138a may be activated and connected by a transfer command signal transmitted over transfer command line 139a.

Alternatively, gate 138a may be disconnected, for example, by a disconnect signal transmitted over disconnect control line 139ad.

Bus register 140 is located at an end of bus wire 100. Bus register 140 is connected to bus wires 100, and to other vertical or horizontal bus wires (e.g., horizontal bus wire 150) through suitable programmable interconnection circuitry 170 (e.g. FIG. 2). Bus register 140 may be used to register the data signals driven on bus wire 100 by LAB 110a. Bus register 140 may, for example, be a one-bit shift register into which data signal bits are sequentially loaded and unloaded. Data signals stored in bus register 140 may be serially transmitted to LAB 110b over horizontal bus 150.

Figure 1C:
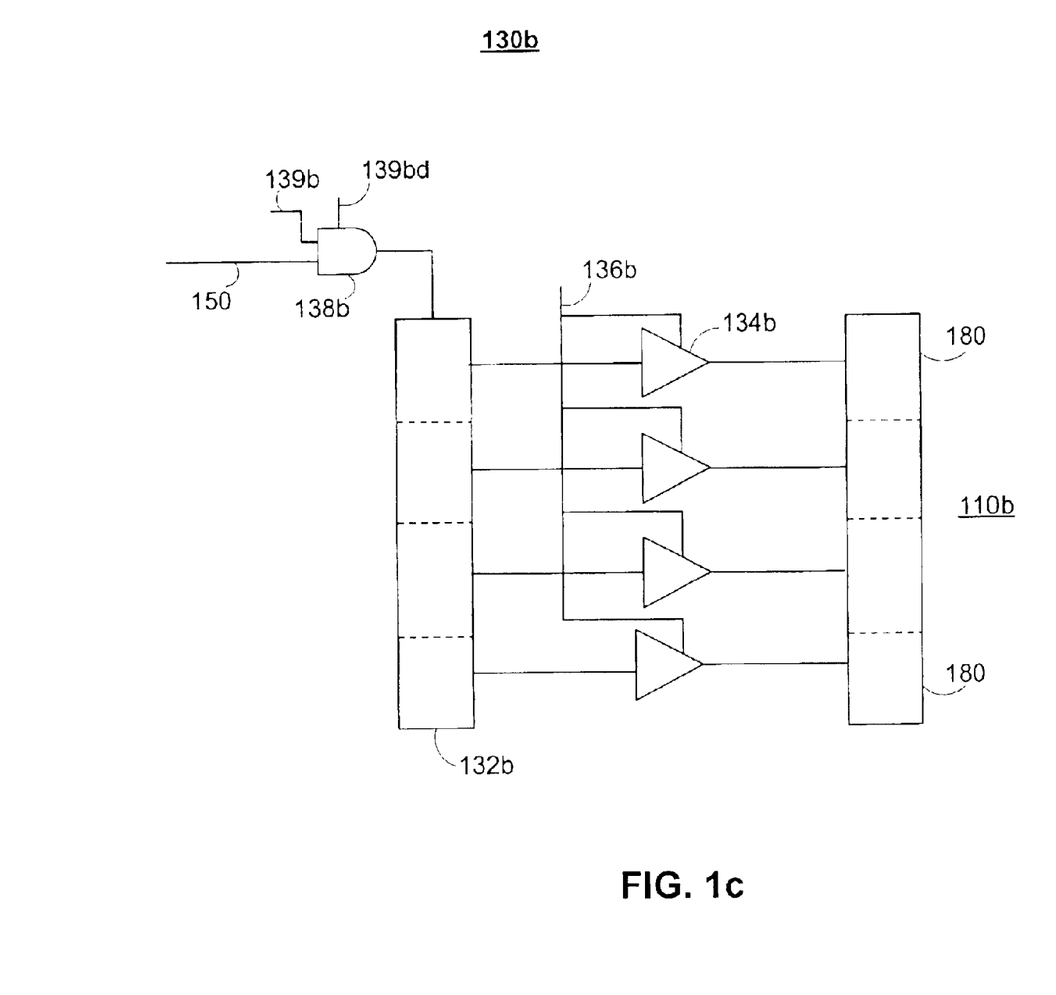
FIG. 1c is a schematic diagram illustrating the provision of deserializing circuitry for unloading time-multiplexed data signals from a bus wire, in accordance with the invention.

LAB 110b receives serial time-multiplexed signals transmitted over bus wire 150 through programmable bus connecting circuitry 130b. Bus connecting circuitry 130b deserializes the time-multiplexed data signals and provides parallel input to LAB 110b logic cell elements (gates) 180. With reference to FIG. 1c, bus connecting circuitry 130b may, for example, include shift register 132b. Shift register 132b associated with one or more LABs along bus wire 150 may be connected to bus wire 150 through conventional tristate logic circuitry. For example, shift register 132b may be connected to bus wire 150 through disconnectable gate 138b. Gate 138b may be activated and connected by a transfer command signal transmitted over transfer command line 139b.

Alternatively, gate 138b may be disconnected from shift register 132b, for example, by a disconnect signal transmitted over disconnect control line 139b.

Data signals stored in shift register 132b may be used to drive parallel inputs to one or more LAB 110b gates 180. Shift register 132b may be connected to LAB 110b gates 180, through, for example, tristate logic gates 134b. Input data signals stored in shift register 132b may be transferred to gates 180 by activating tristate logic gates 134b by a transfer command signal transmitted over transfer command line 136b.

Bus register 140 and shift registers 132 operate at a clock rate faster than the PLD chip system or reference clock rate. Conventional divider circuitry 195 may be used to divide the chip system clock signal CLK (with a clock-period clk) by an integer J, and to so generate a faster register clock signal CLK/J. The divider circuitry may be programmable to divide the applied clock signal CLK by any of several selectable values of J, for example, from 1 to 20.

Bus register 140 and shift registers 132 may, for example, be clocked by a register clock signal with a clock-period clk/4, which is one fourth of the system clock-period clk. Clocking the registers at this rate may allow up to four time-multiplexed data signals to be transmitted on a single bus wire connection between LAB 110a and 110b within a single PLD system clock-period clk.

Figure 2:
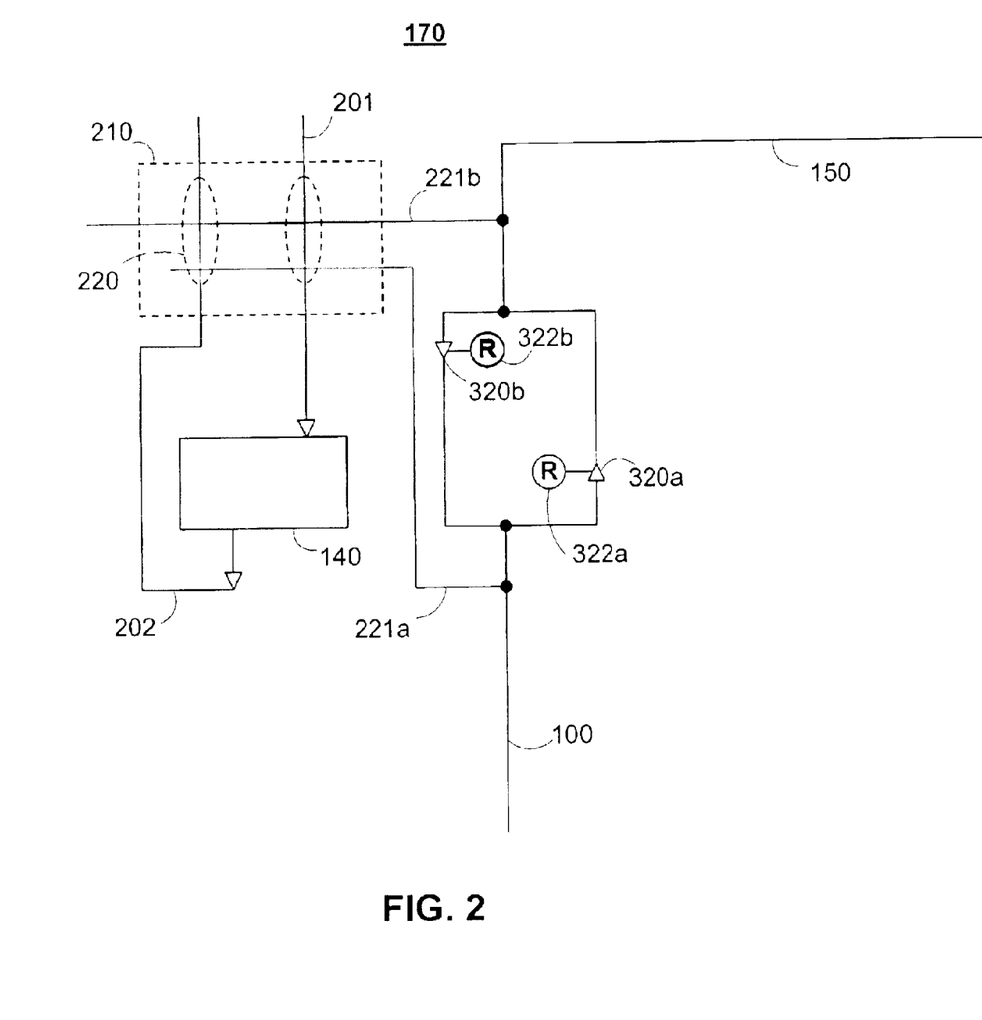
FIG. 2 is a schematic diagram illustrating the provision of a bus register in parallel to segmentation buffers connecting a pair of bus wires, in accordance with the invention.

FIG. 2 illustrates an example of programmable interconnection circuitry 170 that may be used to connect bus wires. Bus wires 100 and 150 may be made, for example, of the long cross-chip horizontal and vertical conductors that are provided for interconnection from one PLD quadrant to another, for example, in Jefferson et al. PLD architectures. Bus wires 100 and 150 are connected through programable segmentation buffer 320. Segmentation buffer 320 may be programmed to allow independent use of either bus wire 100 or bus wire 150 as necessary. Segmentation buffer 320 may be implemented using tri-state buffers or any suitable switching circuitry (e.g., using CMOS pass transistors). Each segmentation buffer 320 is controlled by an associated programmable function control element ("FCE") 322a or 322b. FCEs 322 can be programmed to disable both of the associated buffers 320, in which case bus wires 100 and 150 may be used separately and independently. Alternatively, either one of FCEs 322 can be programmed to enable the associated buffer 320, in which case either bus wire 100 drives bus wire 150 or vice versa. For example, if the buffer 320a is enabled bus wire 100 drives bus wire 150 (as implied in FIG. 1). In this way the two bus wires may be used together.

FIG. 2 also shows bus register 140 associated with the bus wires 100 and 150. Bus register 140 has an input lead 201 and an output lead 202. Programmable links 210 selectively connect bus register 140 to the bus wires in parallel with segmentation buffers 320. Links 210 may, for example, be programmable FCE-controlled cross point switches 220 with switch wires 221 leading to the bus wires.

Programmable interconnection circuitry 170 may be optionally programmed by activating segmentation buffer 320 to use bus wires 100 and 150 as a traditional interconnection conductor carrying a single data signal between two PLD blocks. Alternatively, by activating programmable links 210 to connect bus register 140 the bus wires may be used to register and transmit time-multiplexed data signals between the two PLD blocks. The data path may be directed through register 140 with an appropriate input-output orientation using, for example, cross point switches 220. The input-output orientation may be programmed according to whether bus wire 100 is driving bus wire 150 or vice versa. For example, if bus wire 100 is driving bus wire 150, bus wire 100 is connected to drive register input lead 201 and register output lead 202 is connected to drive bus wire 150. With these connections, a signal on the driving bus wire 100 can travel over input lead 201 to register 140. Register 140 can register the signal and then pass it over output lead 202 to the driven bus wire 150.

Figure 3:
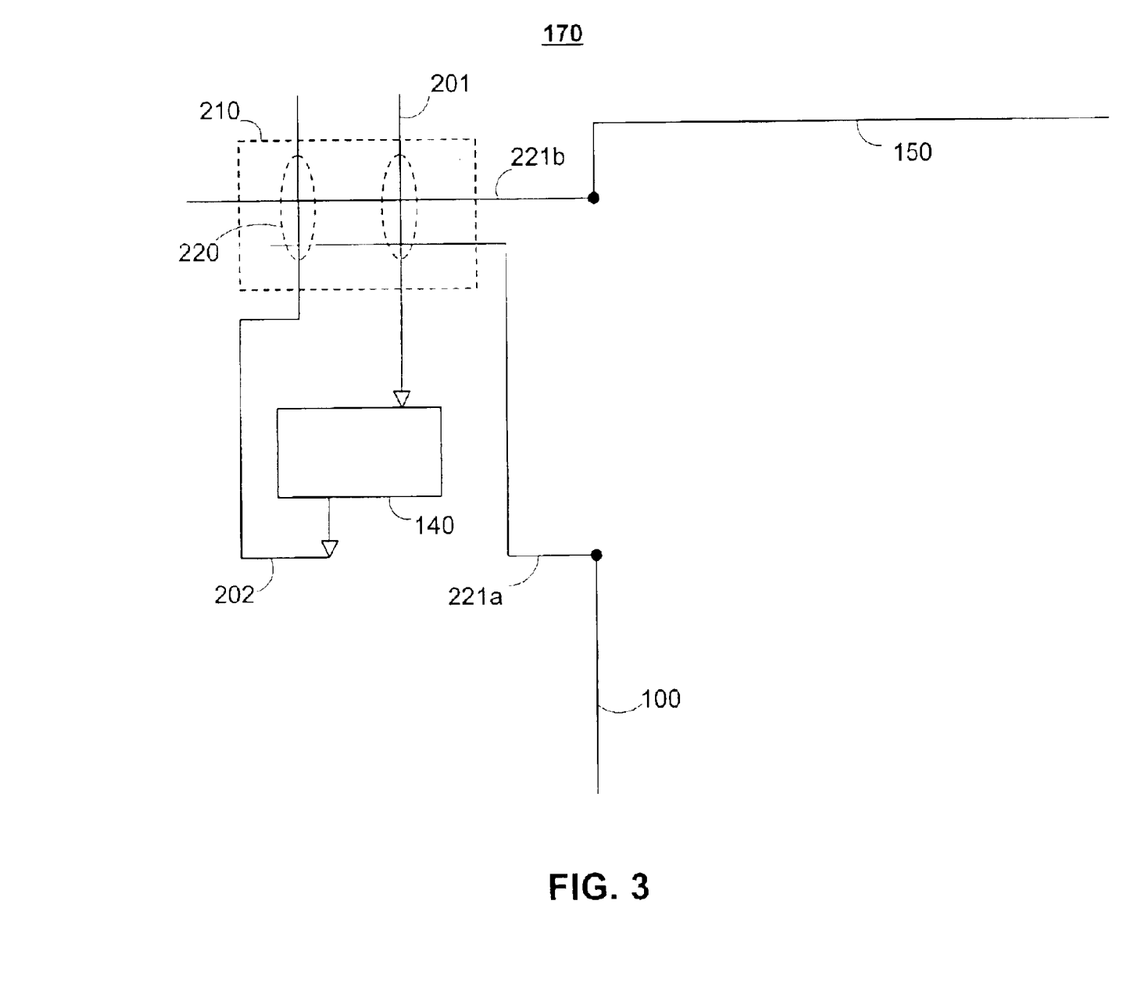
FIG. 3 illustrates a modified PLD architecture corresponding to FIG. 2, with segmentation buffers removed, in accordance with the invention.

In PLD designs with a large chip area, long interconnection conductors are usually provided with segmentation buffers. For example, in PLDs using Jefferson et al. PLD architectures, cross-chip interconnection segmentation buffers are provided at hierarchical partition boundaries. Bus wires 100 and 150 may conveniently use the segmentation buffers that are present in pre-existing PLD designs. Other segmentation buffers may be provided as suitable in some PLD circuits. In some PLD circuits long or short bus wires 100 and 150 may be provided without the associated programmable segmentation buffers such as described, for example, above. Omitting programmable segmentation buffers that are associated with bus wires may reduce the costs incurred in providing them. FIG. 3 shows bus wires 100 and 150 in a modified architecture without programmable segmentation buffers 320. Bus wires 100 and 150 are physically disjoint at their proximal ends, in the absence of buffers 320. In this modified PLD architecture, data paths between cross-chip device elements may be established using associated bus register 140 to link physically disjoint bus wires 100 and 150. The linking of disjoint segments can occur in the same manner as the linking of bus wires disconnected by disabling buffers 320 discussed above with reference to FIG. 2.

Figure 4:
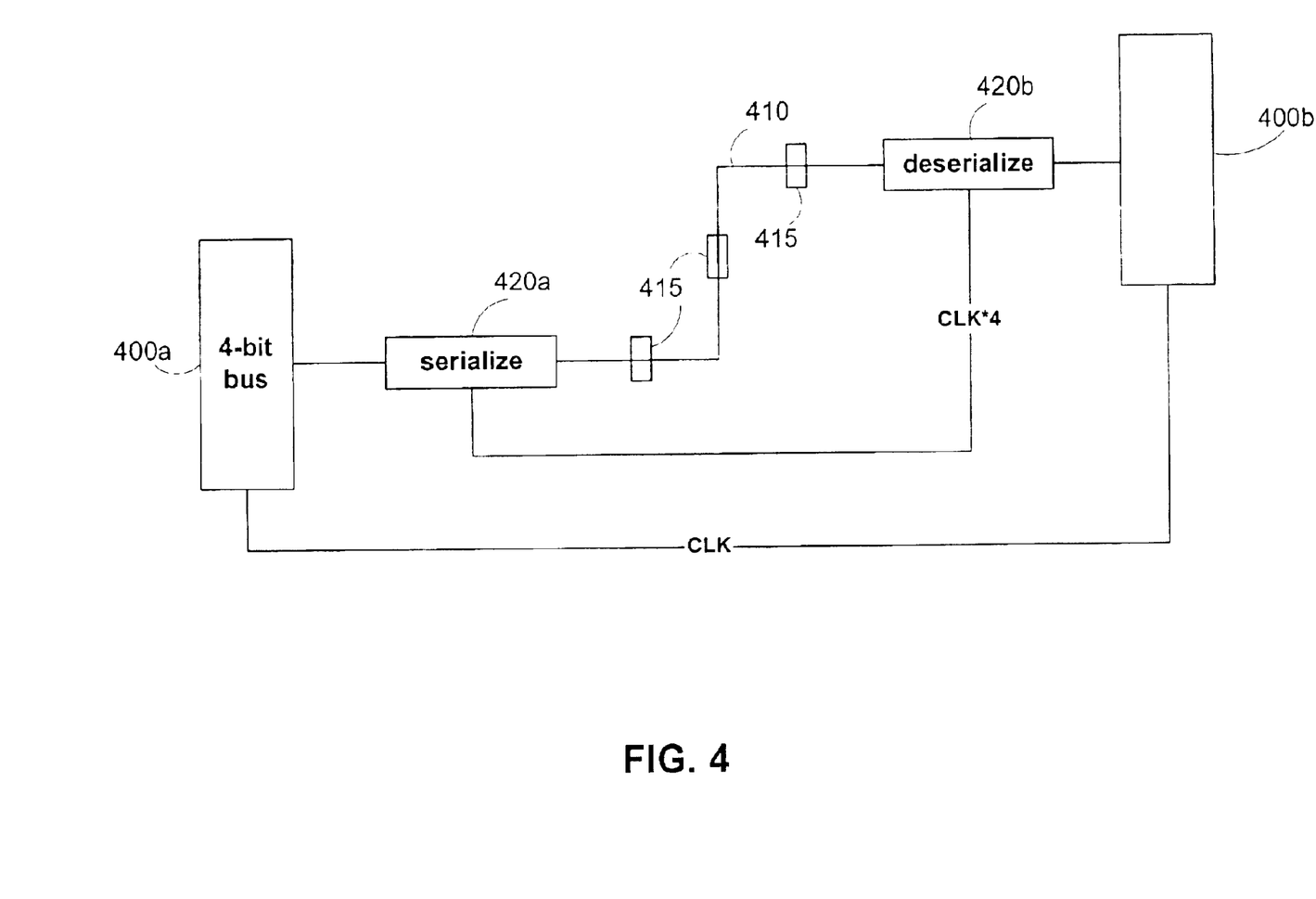
FIG. 4 is a schematic diagram illustrating vertical busses and the data path for transmission of a serialized data signal between adjoining busses, in accordance with the invention.

FIGS. 1–3 illustrate PLDS having both vertical and horizontal bus wires. It will be appreciated, as mentioned earlier, that only vertical or horizontal bus wires may be provided in some PLDS. For example, FIG. 4 schematically illustrates a configuration of two vertical busses 400 running vertically across PLD 55. Busses 400 are clocked by PLD system or clock signal CLK with a clock-period clk. Busses 400 may, for example, be 4-bit busses, which are capable of carrying four time-multiplexed data signals. A signal path 410 traversing the PLD in a generally horizontal direction links vertical bus 400a to adjoining vertical bus 400b. Serializing register circuitry 420a serializes bus 400a data signals and drives a serial output signal 415 over path 410. Serializing register circuitry 420b deserializes the output signal 415, and provides input to adjoining bus 400b. Serializing/deserializing circuitry 420 may be clocked, for example, by register clock signal CLK*4 with a clock-period clk/4. By clocking serialization/deserialization circuitry 420 in this manner, four data signals may be time-multiplexed and moved across the PLD chip within a clock period clk (of device reference clock signal CLK), using only one fourth of the traditional interconnection wiring resources required.

It will also be appreciated by those skilled in the art that commonly used register control signals (e.g., clear, reset, clock, and enable) that are generated by surrounding logic in conventional PLD operation are appropriately routed and made available for operation of bus registers and the serializing/deserializing circuitry of the present invention.

The registering of data signals at bus wires ends adds a time delay equal to the register clock-period (e.g., clk/J above) to the transit time of each subsequent data signal. Adding time delay to signal data paths may seem counter intuitive and contrary to general design goals of minimizing PLD critical path lengths. However, in typical PLD circuit designs the vast majority of data paths are not critical even when the data paths include long interconnection conductors or bus wires. There are many register-register paths which are sub-critical, and which even with the addition of a few clk/J delay periods remain sub-critical paths. The bus registering scheme of the present invention is most advantageously used for such subcritical paths to reduce the PLD interconnection line count and the chip area devoted to interconnection resources.

The disclosed bus-like structures may be made visible at the top levels of the Computer Aided Design (CAD) hierarchy used to design PLDs. The present invention may be then advantageously implemented in large "systems-on-a-chip" type PLDs. Visibility of the busses at the top levels of the design hierarchy may allow designers to optimally floor plan global interconnect schemes, utilize the bus wires, and to register the bus wires at one or both ends.

Additionally or alternatively, the detailed PLD bus wiring scheme or architecture may be made transparent to PLD users through suitable software. For example, the detailed PLD bus wiring scheme or architecture may be provided with a suitable electronic design interface for interfacing with an architecture-independent library of logic functions or modules (i.e., library parameterized modules (LPMs)). Further, the CAD software may be configured to use suitable bus wire LPMs to automatically incorporate time-multiplexed bus wires and synchronized bus registers in a PLD circuit design. Design entry tasks are simplified by making the bus wiring architecture user-transparent in this manner. For example, on user specification of a few design parameters such as the desired bus width and throughput, the CAD software may be configured to automatically generate a circuit netlist implementing data signal serialization/deserialization and time-multiplexed scheduling of data signals on bus wires.

In the examples shown above in FIGS. 1–4, bus wires and serializing/deserializing circuitry were illustrated using 4-bit time-multiplexed signals. It will be appreciated that in accordance with the present invention, bus wires and serializing/deserializing circuitry may be configured to time-multiplex any suitable number of data signals.

The bus and serializing/deserializing registers that are provided in accordance with this invention are generally for dedicated use for registering and serializing/deserializing bus signals respectively. The bus and serializing/deserializing registers are therefore preferably provided in addition to and substantially separate from the other resources (which may include other registers) conventionally provided on the programmable logic device.

Figure 5:
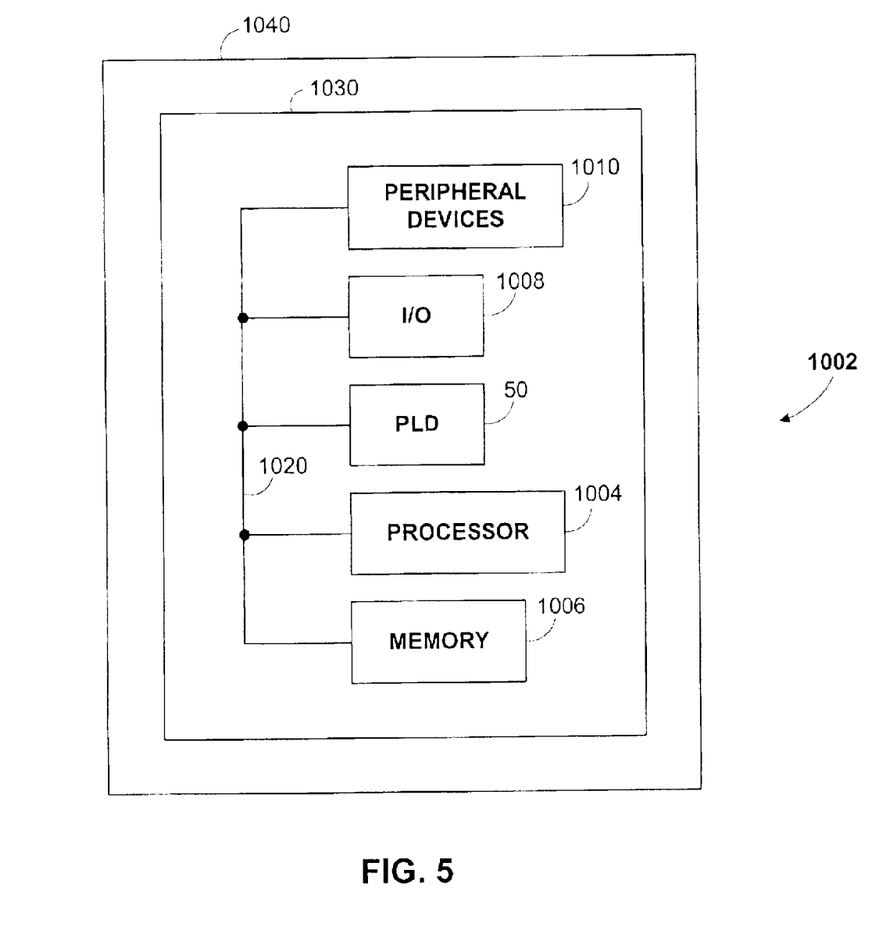
FIG. 5 is a simplified block diagram of an illustrative system employing a programmable logic device, in accordance with the invention.

FIG. 5 illustrates a programmable logic device 50 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 50 can be used to perform a variety of different logic functions. For example, programmable logic device 50 can be configured as a processor or controller that works in cooperation with processor 1004. Programmable logic device 50 may also be used as an arbiter for arbitrating access to a shared resource in system 1002. In yet another example, programmable logic device 50 can be configured as an interface between processor 1004 and one of the other components in system 1002. It should be noted that system 1002 is only exemplary, and that the true scope and spirit of the invention should be indicated by the following claims.

Various technologies can be used to implement the programmable logic devices of this invention, as well as the various components of those devices (e.g., the above-described registers and programmable links). For example, the programmable links can be a relatively simple programmable connector such as a FCE-controlled switch or a plurality of switches for connecting any one of several inputs to any one of several outputs, as mentioned above. Alternatively, each programmable link can be a somewhat more complex element which is capable of performing logic (e.g., by logically combining several of its inputs) as well as making a connection. In the latter case, for example, each programmable link can be product term logic, implementing functions such as AND, NAND, OR, or NOR. Examples of components suitable for implementing programmable links are EPROMs, EEPROMs, pass transistors, transmission gates, antifuses, laser fuses, metal optional links, etc. As has been mentioned, the components of the programmable links can be controlled by various, programmable, function control elements ("FCEs"). (With certain programmable link implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferroelectric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the number of device element blocks at each of the various levels in the hierarchy of device element blocks, and the type of the hierarchy itself, can differ from the specific examples mentioned herein. Similarly, the numbers of the various types of interconnection conductors and other elements can deviate from the specific examples mentioned herein. Different types and sizes of logic and memory units and registers can be used if desired. It will also be understood that terms like "row" and "column", "horizontal" and "vertical", "left" and "right", "top" and "bottom", and other directional or orientational terms are used herein only for convenience, and that no fixed or absolute orientations are intended by the use of these terms.

For example, the words in each of the word pairs mentioned above can be reversed if desired.

What is claimed is:

1. A programmable logic device comprising:
   a plurality of regions;
   a plurality of device elements for performing logic functions, disposed on said plurality of regions;
   programmable interconnection resources for selectively linking said plurality of device elements wherein said interconnection resources comprise at least a bus wire capable of transmitting multiple time-multiplexed device element output signals; and
   a bus register to register data signals transmitted on the bus wire.

2. The programmable logic device defined in claim 1 wherein the bus wire and the bus register are clocked at a higher frequency than the device reference clock frequency for scheduling the transmission of multiple device element output signals over the bus wire during a reference clock cycle.

3. The programmable logic device defined in claim 2 further comprising divider circuitry for generating a frequency multiple of the device reference clock frequency.

4. The programmable logic device defined in claim 1 wherein the bus wire is configured to carry data signals between multiple device element pairs.

5. A programmable logic device comprising:
   a plurality of regions;
   a plurality of device elements for performing logic functions, disposed on said plurality of regions;
   programmable interconnection resources for selectively linking said plurality of device elements wherein said interconnection resources comprise at least a bus wire capable of transmitting multiple device element output signals;
   a bus register to register data signals transmitted on the bus wire, wherein the bus wire is configured to carry data signals between multiple device element pairs; and
   serializing circuitry to multiplex device element output signals and to drive a time-multiplexed data signal on the bus wire.

6. The programmable logic device defined in claim 5 wherein said serializing circuitry comprises a first shift register.

7. The programmable logic device defined in claim 6 wherein said serializing circuitry comprises transfer gates linking the multiple device element outputs to the first shift register.

8. The programmable logic device defined in claim 6 wherein said serializing circuitry further comprises a disconnectable gate linking the first shift register to the bus wire.

9. The programmable logic device defined in claim 5 further comprising deserializing circuitry to deserialize the time-multiplexed data signal into parallel device element inputs.

10. The programmable logic device defined in claim 9 wherein said deserializing circuitry comprises a second shift register.

11. The programmable logic device defined in claim 10 wherein said deserializing circuitry further comprises a disconnectable gate linking said bus wire to the second shift register.

12. The programmable logic device defined in claim 8 wherein said deserializing circuitry further comprises a second disconnectable gate linking the bus wire to the second shift register.

13. The programmable logic device defined in claim 10 wherein said deserializing circuitry further comprises transfer gates linking the second shift register to the device element inputs.

14. A programmable logic device comprising:
    a plurality of regions;
    a plurality of device elements for performing logic functions, disposed on said plurality of regions;
    programmable interconnection resources for selectively linking said plurality of device elements wherein said interconnection resources comprise at least a bus wire capable of transmitting multiple device element output signals, wherein said bus wire comprises a pair of disconnected bus wire segments;
    a bus register to register data signals transmitted on the bus wire; and
    programmable links for optionally linking the bus register to the ends of the pair of disconnected bus wire segments.

15. The programmable logic device defined in claim 14 wherein the pair of disconnected bus wire segments comprise a driving segment and a driven segment, and said programmable links comprise circuitry for connecting said bus register's input and output to said driving segment and said driven segment, respectively.

16. The programmable logic device defined in claim 15 wherein said circuitry comprises a cross point switch.

17. The programmable logic device defined in claim 14 further comprising programmable segmentation buffers in parallel to the bus register for optionally linking the pair of disconnected bus wire segments.

18. A digital processing system comprising:
    processing circuitry;
    a memory coupled to the processing circuitry; and
    a programmable logic device as defined in claim 1 coupled to the processing circuitry and the memory.

19. A printed circuit board on which is mounted a programmable logic device as defined in claim 1.

20. The printed circuit board defined in claim 19 further comprising:
    a memory mounted on the printed circuit board and coupled to the programmable logic device.

21. The printed circuit board defined in claim 20 further comprising:
    processing circuitry mounted on the printed circuit board and coupled to the programmable logic device.

22. A programmable logic device comprising:
    a plurality of regions separated by partition boundaries;
    a plurality of device elements for performing logic functions, disposed on said plurality of regions;
    programmable interconnection resources for selectively linking said plurality of device elements across said partition boundaries, wherein said interconnection resources comprise a plurality of conductors which are segmented at said partition boundaries by programmable segmentation buffers which can be disabled to disconnect segments of said conductors;
    re-timing registers associated with said interconnection resources, said device further comprising programmable links for optionally linking one of said registers to a pair of disconnected conductor segments;
    serializing circuitry to multiplex device element output signals and to drive a time-multiplexed data signal on a conductor having segments connected through one of said registers; and deserializing circuitry to demultiplex said time-multiplexed data signal driven on the conductor into parallel device element input signals.

23. The programmable logic device defined in claim 22 wherein said connected conductor segments, said connecting register, said serializing circuitry, and said deserializing circuitry are clocked at a higher frequency than the device reference clock frequency for scheduling the transmission of multiple device element output signals over the conductor during a device reference clock cycle.

24. The programmable logic device defined in claim 23 further comprising divider circuitry for generating a frequency multiple of the device reference clock frequency.

25. The programmable logic device defined in claim 24 wherein the connected conductor segments comprise a driving segment and a driven segment, and said programmable links comprise circuitry for connecting said one register's input and output to said driving segment and said driven segment, respectively.

26. The programmable logic device defined in claim 25 wherein said circuitry comprises a cross point switch.

27. A digital processing system comprising:
    processing circuitry;
    a memory coupled to said processing circuitry; and
    a programmable logic device as defined in claim 22 coupled to the processing circuitry and the memory.

28. A printed circuit board on which is mounted a programmable logic device as defined in claim 22.

29. The printed circuit board defined in claim 28 further comprising:
    a memory mounted on the printed circuit board and coupled to the programmable logic device.

30. The printed circuit board defined in claim 28 further comprising:
    processing circuitry mounted on the printed circuit board and coupled to the programmable logic device.

31. A programmable logic device comprising:
    a plurality of interconnection conductors comprising bus wires; and
    a register selectively connectable to a first bus wire end so that data bits in a time-multiplexed data signal driven on the first bus wire are serially registered by the register and passed on by the register to one of the other of the interconnection conductors.

32. The programmable logic device defined in claim 31 further comprising serializing circuitry for driving time-multiplexed data signals on bus wires.

33. The programmable logic device defined in claim 31 wherein the one of the other of the interconnection conductors is a second bus wire.

34. The programmable logic device defined in claim 33 further comprising deserializing circuitry for demultiplexing time-multiplexed data signals driven on bus wires.

35. The programmable logic device defined in claim 31 further comprising:
    buffer circuitry selectively connectable between the first bus wire end and the one of the other of the interconnection conductors as an alternative to connection through the register.

36. The programmable logic device defined in claim 35 wherein the buffer circuitry is programmable to buffer a signal in either direction between the two interconnection conductors.

37. A programmable logic device comprising:
    a first plurality of architectural blocks;
    a first bus wire configured for possible use in conveying signals between the architectural blocks in the first plurality;
    a second plurality of architectural blocks;
    a second bus wire configured for possible use in conveying signals between the architectural blocks in the second plurality; and
    register circuitry dedicated for possible use in receiving a time-multiplexed data signal comprising data bits from one of the first and second bus wires, registering the signal bit by bit and applying the registered signal bits to the other of the first and second conductors bit by bit.

38. The programmable logic device defined in claim 37 further comprising:
    buffer circuitry configured to selectively apply signals from one of the first and second bus wires to the other of the first and second bus wires as an alternative to use of the register circuitry.

39. The programmable logic device defined in claim 38 wherein the register circuitry is configured to operate in either direction between the first and second bus wires.

40. The programmable logic device defined in claim 39 wherein the buffer circuitry is configured to operate in either direction between the first and second bus wires.

41. A programmable logic device comprising:
    a first and a second device array;
    a plurality of interconnection conductors for providing a signal path between the first and second device arrays;
    serializing register circuitry for serializing first device array output signals and driving a time-multiplexed bus signal over the signal path to the second device array; and
    deserializing register circuitry for deserializing the bus signal and providing inputs to the second device array.

42. The programmable logic device defined in claim 41 wherein the serializing and deserializing register circuitry are clocked by a register clock signal having a clock period which is a fraction of device clock period.

43. The programmable logic device defined in claim 41 wherein the bus signal is four bits wide.

* * * * *